(12) United States Patent
Ohmoto et al.

(10) Patent No.: US 6,867,144 B2
(45) Date of Patent: Mar. 15, 2005

(54) APPARATUS AND METHOD FOR PLASMA PROCESSING HIGH-SPEED SEMICONDUCTOR CIRCUITS WITH INCREASED YIELD

(75) Inventors: Yutaka Ohmoto, Hikari (JP); Hironobu Kawahara, Kudamatsu (JP); Ken Yoshioka, Hikari (JP); Kazue Takahashi, Kudamatsu (JP); Saburou Kanai, Hikari (JP)

(73) Assignee: Hitachi, Ltd., Tokyo (JP)

( * ) Notice: Subject to any disclaimer, the term of this patent is extended or adjusted under 35 U.S.C. 154(b) by 235 days.

(21) Appl. No.: 10/138,635

(22) Filed: May 6, 2002

(65) Prior Publication Data

US 2002/0127858 A1 Sep. 12, 2002

Related U.S. Application Data (63) Continuation of application No. 09/797,571, filed on Mar. 5, 2001, now Pat. No. 6,413,876.

(30) Foreign Application Priority Data

Aug. 25, 2000 (JP) ........................................ 2000-260874
Aug. 25, 2000 (JP) ........................................ 2000-260875

(51) Int. Cl.[7] ............................................. H01L 21/302
(52) U.S. Cl. ....................... 438/706; 438/710; 438/720; 216/58; 216/67
(58) Field of Search ............................. 438/706, 710, 438/712, 720; 156/345; 216/58, 67

(56) References Cited

U.S. PATENT DOCUMENTS

| | | | |
|---|---|---|---|
| 5,535,507 A | 7/1996 | Barnes et al. | |
| 5,817,534 A | * 10/1998 | Ye et al. | ........................ 438/10 |
| 5,980,999 A | * 11/1999 | Goto et al. | ................. 427/572 |
| 6,136,388 A | 10/2000 | Raoux et al. | |
| 6,254,738 B1 | 7/2001 | Stimson et al. | |

FOREIGN PATENT DOCUMENTS

| | | |
|---|---|---|
| JP | 2-65131 | 3/1990 |
| JP | 8-181107 | 7/1996 |
| JP | 8-316212 | 11/1996 |
| JP | 2000-060361 | 3/2000 |

* cited by examiner

*Primary Examiner*—Lan Vinh
(74) *Attorney, Agent, or Firm*—Antonelli, Terry, Stout & Kraus, LLP (57) ABSTRACT

A plasma etching method of a wafer includes the steps of electrostatically attracting the wafer which has a gate oxide film onto a wafer mounting electrode in a vacuum processing chamber, introducing a mixed gas into the vacuum processing chamber on the basis of an etching recipe, generating a magnetic field inside the vacuum processing chamber, generating a plasma in the vacuum processing chamber, applying a bias power to the wafer to accelerate ions in the plasma toward the wafer, and setting an impedance of a portion of the wafer mounting electrode which corresponds to an outer periphery of the wafer as viewed from a bias power supply to a value which is greater than that of a center portion of the wafer mounting electrode using an electrode arranged within the wafer mounting electrode at a position corresponding to the outer periphery of the wafer and formed under an insulating film for electrostatically attracting the wafer.

1 Claim, 9 Drawing Sheets

☐ NORMAL CHIP
■ DEFECTIVE CHIP

APPLICATION OF THIS INVENTION UNDER
LOW-SPEED ETCHING CONDITION
(CAPACITANCE UNADJUSTED)

APPARATUS AND METHOD FOR PLASMA PROCESSING HIGH-SPEED SEMICONDUCTOR CIRCUITS WITH INCREASED YIELD

CROSS-REFERENCE TO RELATED APPLICATIONS

This is a continuation of U.S. application Ser. No. 09/797,571, filed Mar. 5, 2001, now U.S. Pat. No. 6,413,876, the subject matter of which is incorporated by reference herein, and is copending with U.S. application Ser. No. 09/908,844, filed Jul. 20, 2001, now U.S. Pat. No. 6,649,0221, which is a divisional application of U.S. Ser. No. 09/797,571, filed Mar. 5, 2001, now U.S. Pat. No. 6,413,876.

This application also relates to an application U.S. Ser. No. 09/795,487, filed Mar. 1, 2001, by Yutaka Ohmoto et al of the present invention, based on Japanese Patent Application No. 2000-060361 filed Mar. 1, 2000 and assigned to the present assignee. The disclosure of that application is incorporated herein by reference.

BACKGROUND OF THE INVENTION

This invention relates to a plasma processing apparatus such as a plasma etching apparatus used for dry etching semiconductor integrated circuits, and a plasma processing method.

Semiconductor integrated circuits have become more and more miniaturized and complicated to satisfy requirements for higher functions and higher operation speeds. In plasma processing apparatuses for processing such semiconductor integrated circuits, as disclosed in JP-A-2-65131, it has conventionally been known to prevent electrostatic damage of a wafer by disposing a ring having electric conduction around an outer periphery of the wafer.

However, the conventional technology described above is not yet entirely satisfactory for preventing electrostatic damage in gate oxide films the thickness of which has become smaller and in those wafers the diameter of which has become greater such as 12 inches or more. This technology cannot either reduce entirely sufficiently electrostatic damage that changes depending on process conditions varying to large extents.

The plasma etching technologies for processing semiconductor circuits according to the prior art attempt to find out a compatible condition that does not invite damage depending on process parameters but provides good shape processability, and conduct the dry etching process.

However, a process window having high shape processability has become small as the semiconductor devices have become miniaturized and have come to possess a higher aspect ratio while the diameter of the wafers to be processed has become greater. Therefore, it is difficult according to the prior art technologies described above to simultaneously satisfy a process window free from damage and a high processing factor such as a processing rate without their trade-off.

Barns et al U.S. Pat. No. 5,535,507 discloses an electrostatic chuck for supporting a workpiece by electrostatic attraction between the workpiece and an electrode for installing the workpiece, and offsetting etching non-uniformity of the workpiece. However, this reference does not teach or suggest means for preventing a defect due to "charging damage" of the workpiece.

JP-A-8-316212 discloses another technique in which an electrode portion of a wafer mount is divided into a plurality of electrically isolated areas, impedance matching elements are connected to respective areas so as to control the impedances thereof, and alternatively, a recessed portion is provided on the electrode surface of the wafer mount such that the impedances between the wafer and the electrode differ between the center portion and the outer portion of the electrode to make ion energy emitted to the wafer uniform over the entire surface, thereby achieving a uniform plasma process.

As disclosed in JP-A-8-181107, there is known a technique that a surrounding ring formed of ceramic is provided around a lower electrode, a wafer is mounted on the surrounding ring so as to have a space between the wafer and the lower electrode and thereby have an electrostatic capacitance, so that a DC voltage generated in a plasma is distributed into the space, a blocking capacitor and the wafer to prevent occurrence of charging damage to the wafer.

However, both of the techniques do not make reference to the compensation for the charging damage of the workpiece which the present invention intends to solve.

SUMMARY OF THE INVENTION

It is therefore an object of the present invention to provide an apparatus and a method capable of plasma-processing high-speed semiconductor devices, that are susceptible to damage due to charge-up, on a wafer having a large diameter with an increased yield.

It is another object of the present invention to provide a combination of an electrode structure for installing a workpiece, such as a wafer, with a circuit, the combination being for use in an apparatus and a method capable of plasma-processing high-speed semiconductor circuits with an increased yield.

According to one aspect of the present invention for accomplishing the objects described above, an insulating material covering an entire surface of an electrode opposing the back of a workpiece (wafer) is thicker at a part thereof than at other portions, and an electrode is separately disposed inside the insulating material. A bias current is supplied to the electrode, and the amount of the bias current is regulated.

In other words, according to one aspect of the present invention, there is provided a plasma processing apparatus so constituted as to be able to apply bias power to a workpiece, wherein a feed impedance difference of bias power to a plurality of positions inside the workpiece is variable.

According to another aspect of the present invention, there is provided a plasma processing apparatus, wherein an insulating film is interposed between a workpiece installing electrode and a workpiece, the insulating film has at least two kinds of thickness, at least one kind of the insulating film contains an electrically conductive material, and the conductive material is connected to a bias power feed line insulated from the electrode.

According to still another aspect of the present invention, there is provided a plasma processing apparatus including a workpiece installing electrode and an insulating film interposed between the electrode and a workpiece, wherein the insulating film is made of at least two kinds of materials, at least one kind of the insulating film contains an electrically conductive material, and the conductive material is connected to a bias power feed line insulated from the electrode.

According to still another aspect of the present invention, the impedance of the bias power feed line of the plasma processing apparatus described above is variable or a power supply circuit for electrostatic attraction is connected to the bias power feed line.

In a plasma processing apparatus for converting a raw material gas to plasma and plasma-processing a surface of a workpiece, including a vacuum vessel having exhaust means, raw material gas supplying means, installing means for installing a workpiece such as a wafer, and means for applying radio frequency power to the workpiece, still another aspect of the present invention provides an electrode structure including a bias circuit for use in the plasma processing apparatus, wherein an insulating film is interposed between an electrode for installing the workpiece and the workpiece, the insulating film has an electrically conductive material disposed at a part thereof; and the conductive material is electrically grounded.

According to still another aspect of the present invention, the conductive material in the insulating film interposed between the workpiece and the electrode described above is electrically grounded through an impedance variable device.

According to still another aspect of the present invention, the conductive material in the insulating film described above is electrically connected to the electrode for installing the workpiece through the impedance variable device.

According to still another aspect of the present invention, there is provided a method for plasma-processing a workpiece wherein a set value of the impedance variable device described above is adjusted in accordance with a dielectric breakdown pattern that occurs in the workpiece.

In another aspect of the present invention, a plasma processing apparatus for processing a wafer as ions in a plasma are induced, comprises a wafer-installing stage on which the wafer is installed; an wafer-installing surface of said stage electrically isolated; a circuit connected with the electrically isolated wafer-installing surface supplied with a bias power; and adjusting means for making equally adjustable an impedance of the circuit through which a current flows from each position on said wafer to the ground through said wafer and said plasma.

In a further aspect of the invention, a plasma processing apparatus comprises: a workpiece-installing stage electrically insulated from a grounded vacuum vessel; said stage including a first electrode forming a base, an insulating film provided on said first electrode and having its outer peripheral portion thicker than the thickness of its center portion and a second electrode provided within the outer peripheral portion of said insulating film and at a position having the same thickness as the center portion of said insulating film, said first electrode being connected to a radio frequency power supply; and an impedance adjuster electrically connecting said first electrode and said second electrode.

In the above-plasma processing apparatus, said insulating film includes a first insulating film provided between said first electrode and said second electrode and a second insulating film provided on a side of workpiece-installing surface.

In still another aspect of the invention, a plasma processing method of processing a wafer while inducing ions in a plasma thereto, comprises the steps of: changing an impedance of each position on a wafer installing surface of a workpiece-installing stage on which the wafer is installed during a plasma process such that the bias potential difference within the wafer surface through the plasma at a plurality of said positions due to bias voltages applied to the wafer is reduced to a breakdown voltage of transistors formed on said wafer or less; and subjecting said wafer to a plasma process.

In a further aspect of the invention, a plasma processing method for a substrate of a wafer, comprises the steps of: causing a value of an applied self bias voltage (Vdc) at each position within the surface of a wafer minus an average of the applied self bias voltage (Vdc) within the surface of the wafer to indicate a minus value, and adjusting an impedance of a position on the wafer in which an absolute value of said minus value is larger, so as to increase.

Other objects, features and advantages of the present invention will become apparent from the following description of the embodiments of the invention taken in conjunction with the accompanying drawings.

DESCRIPTION OF THE EMBODIMENTS

Figure 1:
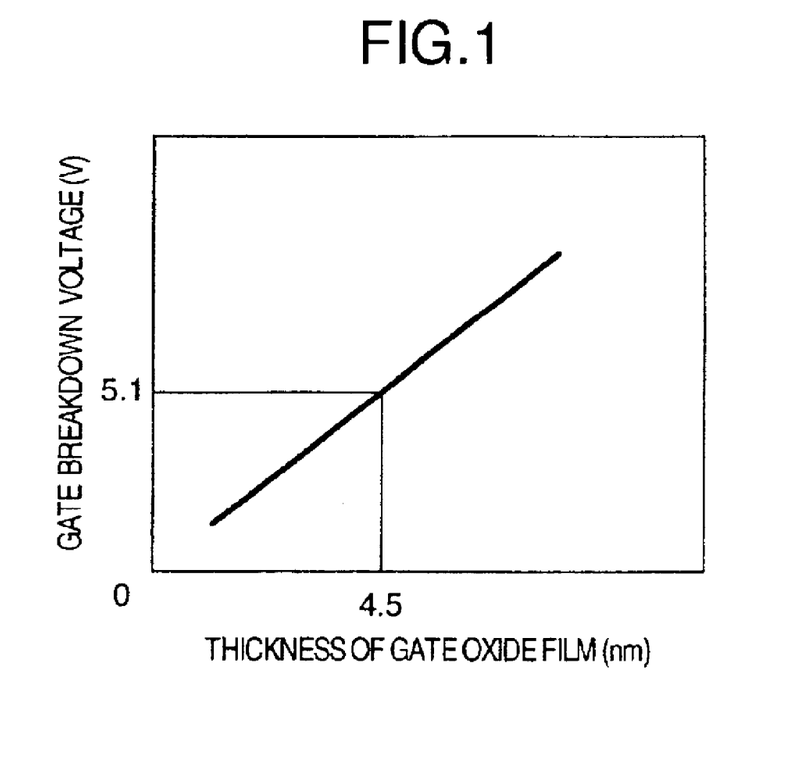
FIG. 1 is a graph showing the relation between a thickness of a gate oxide film and a gate breakdown voltage.

Referring initially to FIG. 1, a prior art technology will be explained in detail in order to have the present invention more easily understood prior to the description of the embodiments thereof.

High-speed semiconductor devices have an extremely thin gate oxide film, and a gate breakdown voltage becomes smaller with the decrease of the film thickness as shown in FIG. 1. Therefore, electrostatic damage occurs due to a potential difference between the gate oxide films unless plasma processing utilizing charged particles, such as dry etching, is conducted while the charged particles are subtly balanced.

The potential of a wafer base material (silicon) is governed by a mean value of charge amounts flowing in from plasma above a wafer whereas the potential on the gate oxide film is governed by the inflow amount of the charges from plasma existing locally over the gate oxide film. Therefore, even a limited difference of the inflow amount of the charges on the entire wafer surface results in the potential difference on and beneath the gate oxide film (that is, the potential difference of the silicon base material). This phenomenon is referred to as "damage resulting from charge-up".

To cope with this problem, prior art technologies prevent damage due to charge-up by using an electrically conductive ring disposed round the outer periphery of the wafer.

Since this method locally changes the plasma density of the outer periphery, its control range is so narrow for processing recent wafers having large diameters of 12 inches or more. Particularly, this method cannot sufficiently suppress damage of the gate oxide films the thickness of which has become smaller and smaller.

The inventors of the present invention have discovered a method that can cope with the decreasing thickness of the gate oxide films and the increasing diameters of the wafers to be processed, and has a large control range and high control performance. The inventors have thus completed the present invention. Hereinafter, preferred embodiments of the present invention will be explained.

Embodiment 1

Figure 2:
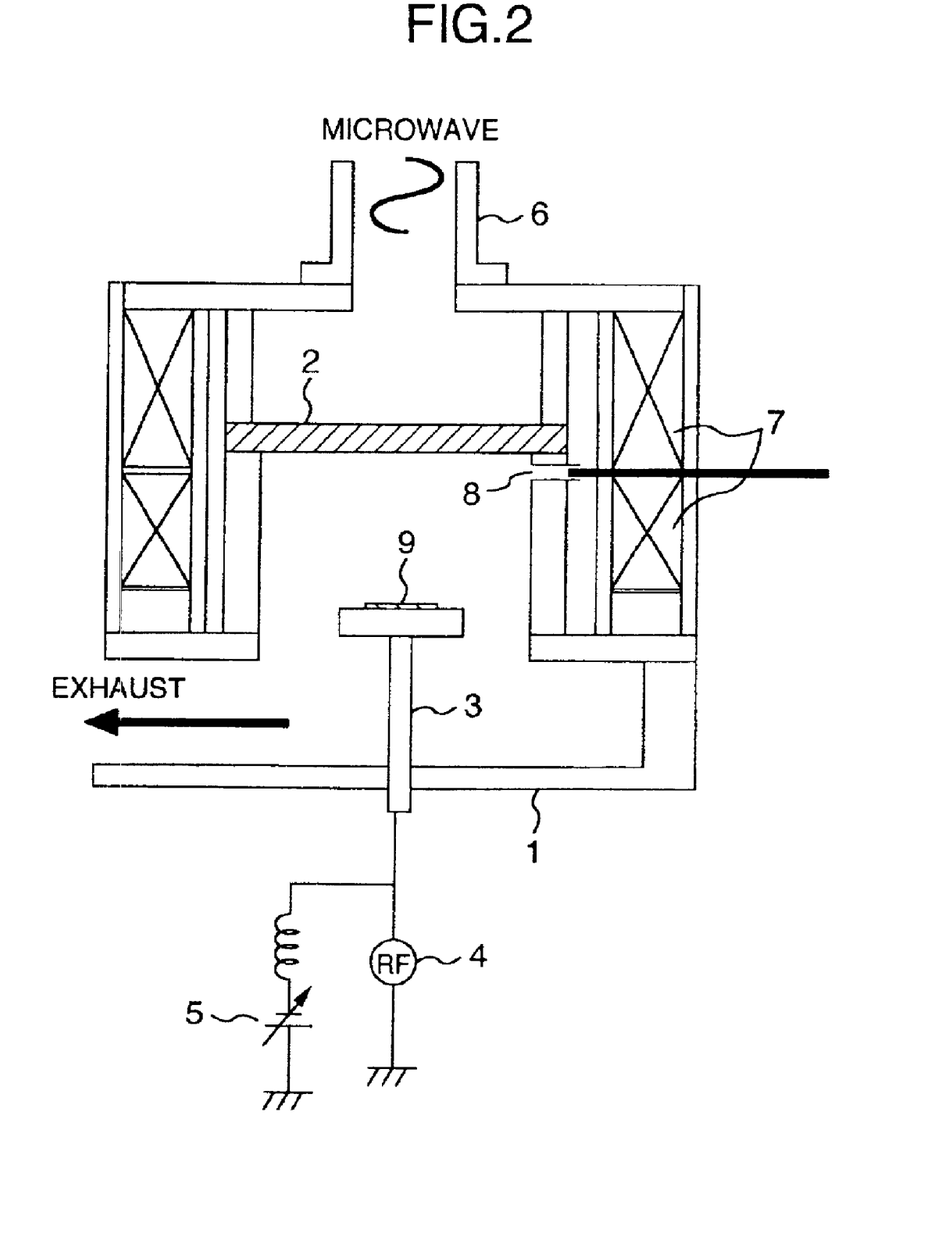
FIG. 2 is a schematic sectional view of a microwave dry etching apparatus.

FIG. 2 is a schematic sectional view of a microwave dry etching apparatus (plasma processing apparatus) according to this embodiment.

A vacuum processing chamber 1 accommodates a quartz window 2 for introducing a microwave, an electrode 3 for installing a wafer 9 having semiconductor integrated circuits, so positioned as to oppose the quartz window 2, a radio frequency power supply 4 for generating a bias voltage to the electrode 3 and a DC power supply 5. A waveguide 6 for introducing the microwave is interconnected to the quartz window 2. A solenoid coil(winding)7 is further provided to generate a magnetic field inside the vacuum processing chamber 1.

A gas inlet 8 is for introducing a mixed gas into the vacuum processing chamber 1 on the basis of an etching recipe.

When the etching apparatus shown in FIG. 2 uses a conventional electrode, a wafer outer periphery is close to a ground electrode while a wafer center is far from the ground electrode. Therefore, a bias current flows more easily through the wafer outer periphery. In other words, impedance is lower at the wafer outer periphery.

Therefore, a lead-in amount of the charged particles due to biasing is great at the wafer outer periphery. Particularly because a large electron current is led in, the potential of the wafer base material shifts in the negative direction and a positive potential difference occurs in the gate oxide film at the wafer center, inviting the occurrence of damage. This potential difference greatly varies depending on the plasma condition and on the magnetic field condition.

To suppress this damage, non-uniformity in easiness of the flow of the bias current described above must be offset, and means capable of regulating the offset is further necessary so as to cope various process conditions.

Figure 3:
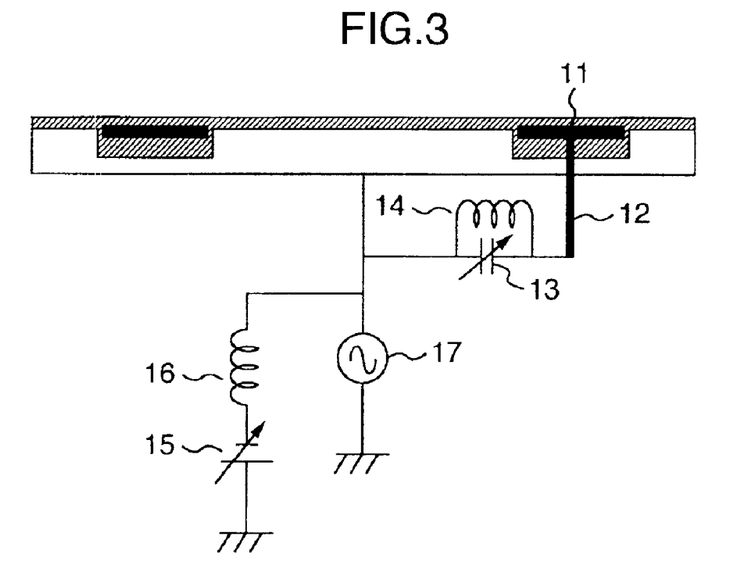
FIG. 3 is a schematic sectional view of a wafer-installing electrode according to Embodiment 1 of the present invention.

Therefore, an experiment is conducted in the present invention by assembling a wafer-installing electrode having a structure shown in FIG. 3 into the apparatus shown in FIG. 2.

The wafer-installing electrode shown in FIG. 3 is made of aluminum as a base material, and an alumina film is sprayed to its surface. The coating thickness of the alumina film at a ring-like portion from $2/3$ of the electrode diameter to the outermost periphery is about thrice the thickness at the inner periphery.

An electrode 11 made of a tungsten material is buried to a position at a depth of about $1/3$ from the surface of the ring-like portion, and a feed line 12 insulated from the base material of the wafer installing electrode is connected to the electrode 11.

The feed line 12 is connected to a bias power supply circuit including a bias RF power supply 17 with the electrode base material through a parallel circuit of a variable capacitor 13 and a filter coil 14.

The variable capacitor 13 can be short-circuited or opened and can change its capacitance from infinity to 0. Incidentally, the filter coil 14 connected in parallel with the variable capacitor 13 permits the passage of the DC current. When the wafer is electrostatically attracted and processed, too, the DC charge is supplied from the DC power supply 15 through the tungsten electrode 11 to the surface of alumina on the outer peripheral side of the electrode. In this way, the wafer can be electrostatically attracted in the same way as in the conventional electrode. Reference numeral 16 represents a DC pass filter.

In the case of the conventional electrode, the bias current is uniformly supplied to each position inside the wafer plane. Therefore, damage occurs due to charge-up that results from the difference of the impedance from each position within the surface of wafer to the ground.

In contrast, when the electrode according to the present invention is used, the impedance of the portion of the electrode corresponding to the outer periphery of the wafer, as viewed from the bias power supply, can be set to a greater value within a certain range than that of the portion of the electrode corresponding to the wafer center portion. In consequence, a part of the bias current is supplied from the water center portion to the wafer outer peripheral portion through the bulk resistance of the wafer. When the value of the variable capacitor 13 is adjusted, a bypass current can be offset with the impedance from the wafer to the ground.

Figure 4:
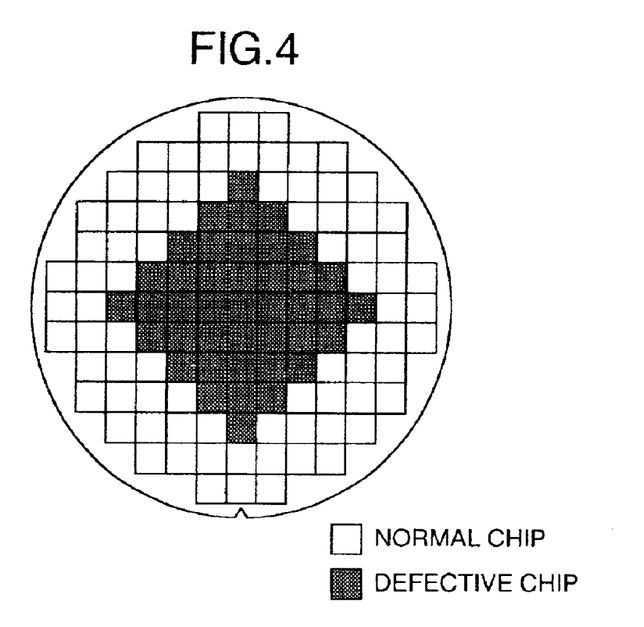
FIG. 4 is a schematic view showing a damage occurrence condition at the center of a test wafer exposed to plasma in the present invention.

Wafers for testing damage are exposed to plasma under a process condition capable of high-speed etching. At this time, damage due to charge-up develops at the center of the test wafer using the conventional electrode as shown in FIG. 4.

Figure 5:
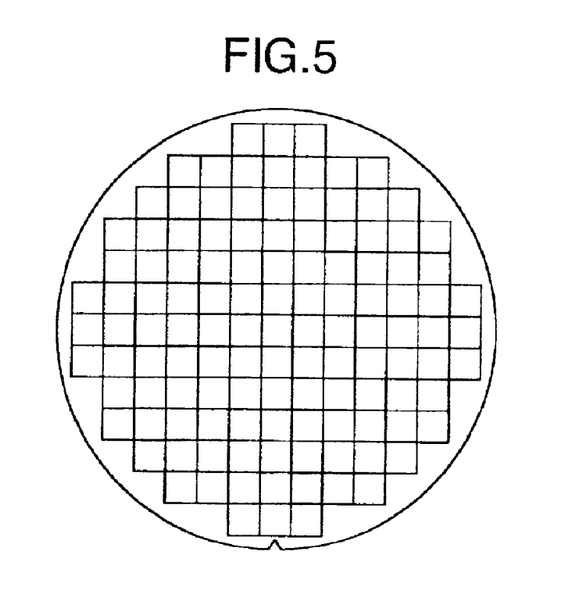
FIG. 5 is a schematic view showing a damage occurrence condition at the center of a test wafer exposed to plasma in the present invention.

When the test is similarly conducted by using a wafer having the electrode according to the present invention and by setting the value of the variable capacitor 13 to 500 pF, the damage occurrence ratio can be reduced to 0% as shown in FIG. 5.

Figure 6:
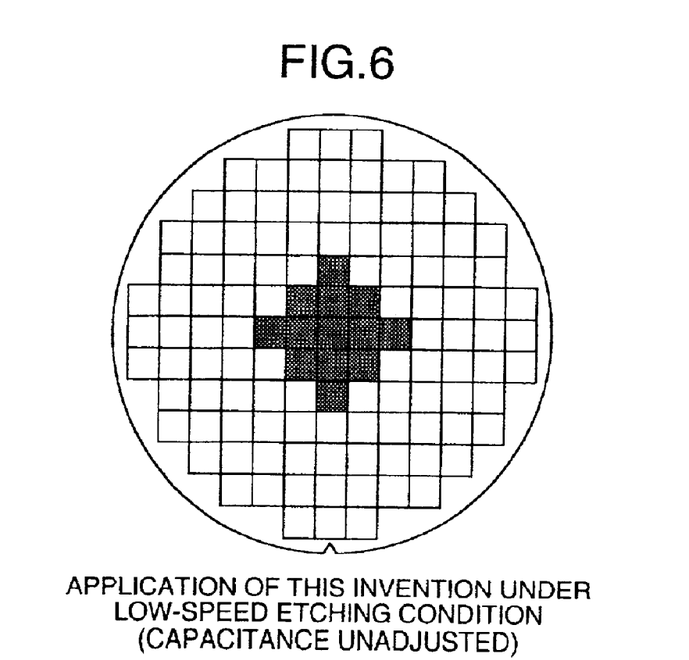
FIG. 6 is a schematic view showing a damage occurrence condition at the center of a test wafer under a low-speed etching condition.

However, when the test is further conducted for the damage test wafer under a low-speed etching condition by setting the capacitance of the variable capacitor to 500 pF, damage again develops at the center as shown in FIG. 6.

This damage occurs because the impedance difference from the bias power supply to the wafer becomes excessively greater than the impedance difference from the wafer to the ground through plasma. When the capacitance of the variable capacitor 13 is set to 2,000 pF in this case, the impedance differences can be offset and the damage occurrence ratio can be reduced to 0%.

In this embodiment, the thickness of the alumina film of the outer peripheral portion is changed, but similar effects can be obtained when the insulating film at the outer peripheral portion is changed to a material having a lower dielectric constant than alumina such as a resin.

The impedance adjusting has been carried out by the electrode 11 provided in the outer periphery of the electrode in this embodiment, but it may be alternatively performed by the wafer-installing electrode (stage). In that case, the thickness of the insulating film at the upper portion of electrode 11 is made thicker than that of the insulating film at the center portion of the electrode 11. The thickness of the insulating film at the lower portion of the electrode 11 is made thicker than that of its upper portion. The electrode 11 is connected to the RF power supply 17, and the wafer-installing electrode(stage) is connected to the RF power supply 17 through an impedance adjuster composed of a variable capacitor 13 and a filter coil (winding) 14. In the circuit thus constructed, the impedance of a portion of the electrode 11 corresponding to the periphery of the wafer is preset at a large value. Then, the impedance of the portion of the electrode corresponding to the center portion of the wafer is adjusted to thereby enable suitable adjustment of the impedance within the surface of the wafer.

Embodiment 2

Figure 7:
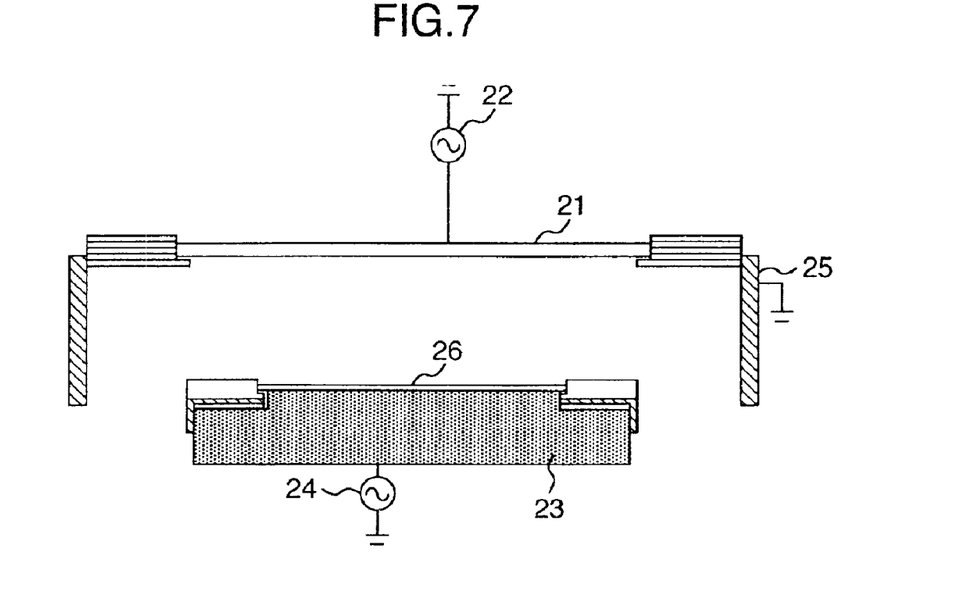
FIG. 7 is a schematic sectional view of a plasma etching apparatus according to Embodiment 2.

Referring next to FIG. 7, a plasma etching apparatus (plasma processing apparatus) having three electrodes will be explained. Reference numeral 21 denotes an upper electrode. The upper electrode 21 is connected to a plasma generation power supply 22. When radio frequency power is applied, plasma is generated between the upper electrode 21 and a lower electrode 23. The plasma thus generated keeps the center potential at the ground potential by a ground 25 provided to the sidewall of the chamber.

A bias power supply 24 connected to the lower electrode 23 generates a radio frequency voltage to a wafer 26, accelerates ions inside the plasma and processes the wafer 26.

Figure 8:
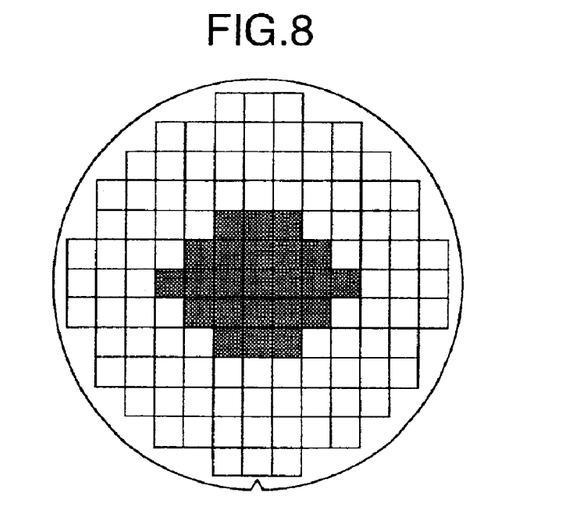
FIG. 8 is a schematic view showing a damage occurrence condition at the center of a test wafer in Embodiment 2.

A process condition is established in such a fashion that the processing shape becomes uniform inside the wafer plane. It is found at this time that the plasma density distribution is not always uniform but exhibits a lower density distribution in the space above the wafer center than at other portions. When the characteristics of the gate oxide film are measured at this time, defects resulting from damage occur as shown in FIG. 8.

Etching of the wafers using the electrode having the structure shown in FIG. 3 is conducted in the same way as in Embodiment 1 under the same process condition and by adjusting the capacitance of the variable capacitor 13. As a result, the percent defective can be reduced to 0%.

Embodiment 3

Figure 9:
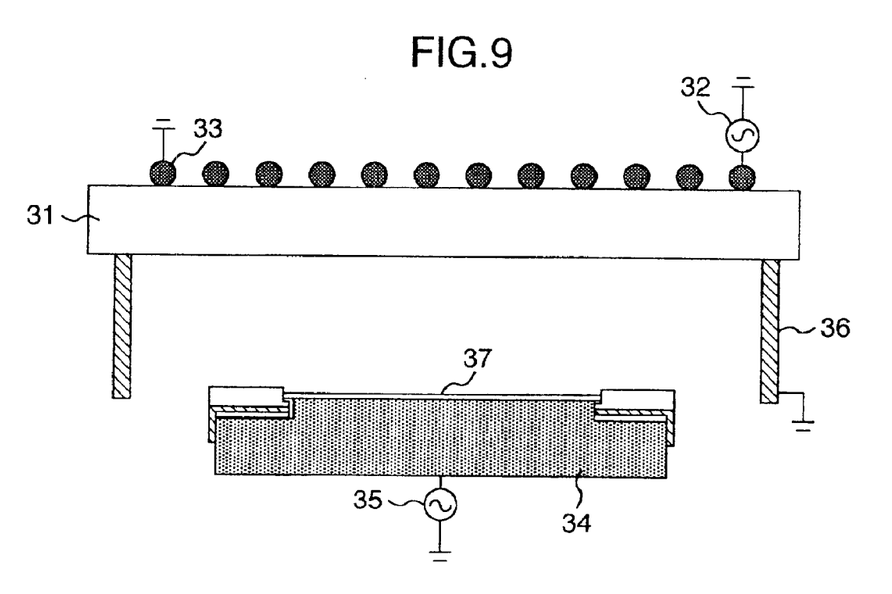
FIG. 9 is a schematic sectional view of a high-density plasma etching apparatus according to Embodiment 3.

FIG. 9 shows another embodiment wherein a wafer is etched by using a high-density plasma etching apparatus, that is, a plasma processing apparatus.

Reference numeral 31 denotes an introduction window. A coil 33 is put on this window 31. Plasma is generated between the introduction window 31 and a wafer-installing electrode 34 when power is supplied from a radio frequency power supply 32 to the coil 33.

When a voltage is applied from a bias power supply 35 to a wafer 37 connected to the wafer-installing electrode 34, etching is conducted as ions are accelerated and irradiated to the wafer 37 by plasma. Incidentally, the ground 36 fixes the plasma potential so that a bias voltage can be applied.

Figure 10:
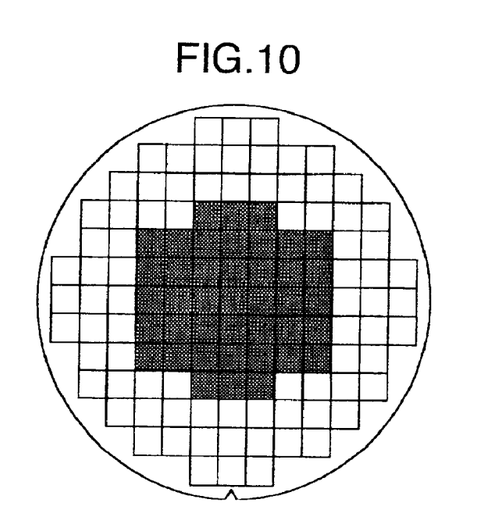
FIG. 10 is a schematic view showing a damage occurrence condition at the center of a test wafer in Embodiment 3.

Etching is conducted by this etching apparatus using the conventional electrode while the process condition is so adjusted as to provide a desired etching shape. When the characteristics of the gate oxide are then measured, the occurrence of defect is observed as shown in FIG. 10.

This defect is presumably affected by the impedance difference that results from the difference of each point of wafer to the ground. When etching is conducted by using the electrode having the structure shown in FIG. 3 and by adjusting the capacitance of the variable capacitor in the same way as in Embodiment 2, the percent defective can be reduced to 0%.

Embodiment 4

Figure 11:
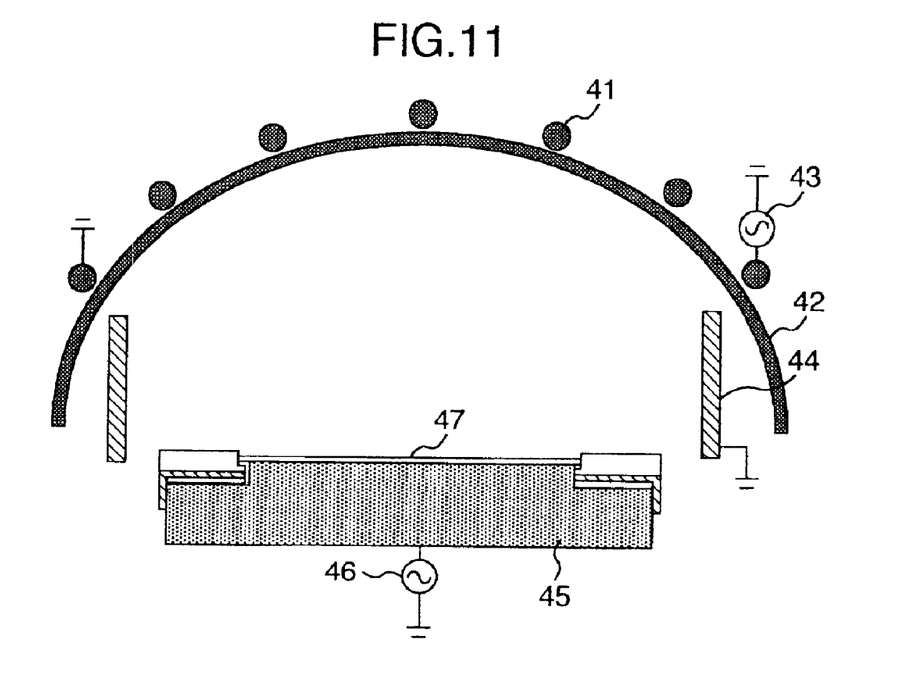
FIG. 11 is a schematic sectional view showing a bias CVD apparatus in Embodiment 4.

FIG. 11 is a schematic sectional view of a plasma processing apparatus as a bias CVD apparatus that is used in this embodiment.

In this bias CVD apparatus, power is supplied from a radio frequency power supply 43 to a coil 41 positioned on a quartz chamber 42 to generate plasma in a film forming gas atmosphere, and a voltage is supplied from a bias power supply 46 to an electrode 45 on which a wafer 47 is installed. Ions in plasma are accelerated to improve film coating property and an insulating film is deposited on a wire formed on the wafer 47. A ground 44 fixes the plasma potential so that bias can be applied.

The wire is directly exposed to plasma at the start of the film formation. Therefore, the gate oxide film connected to this wire has the possibility of suffering charge-up damage.

Figure 12:
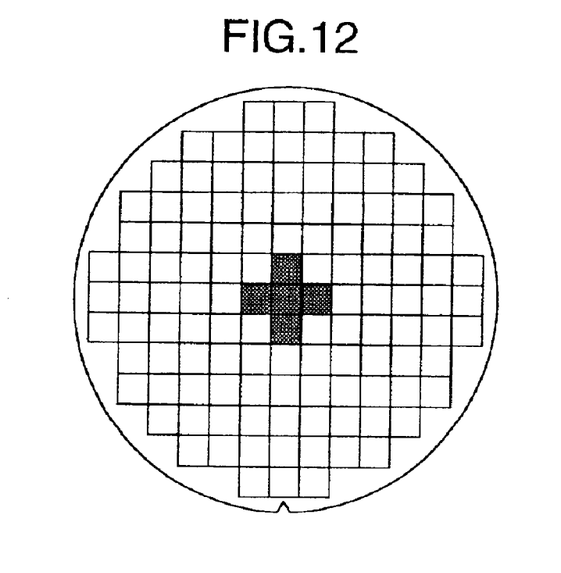
FIG. 12 is a schematic view showing a damage occurrence condition at the center of a test wafer in Embodiment 4.

Film formation is conducted by using the conventional electrode and by adjusting the process condition so that a film can be formed uniformly with high coating property. When the electric characteristics of the gate oxide film are thereafter measured, a defect develops inside the wafer as shown in FIG. 12.

In contrast, when film formation is conducted by using the electrode having the structure shown in FIG. 3 and by adjusting the capacitance of the variable capacitor under the same process condition in the same way as in Embodiment 3, the percent defective can be reduced to 0%.

Examinations made by the present inventors reveal that particularly when a wafer bias is applied, charging damage occurs in many cases because a slight difference occurs in the impressed bias voltage due to the impedance difference from a position inside the wafer plane to the ground, and the lead-in amount of the charged particles becomes different.

Therefore, it has been a customary practice to find out a condition in which electrostatic damage does not occur, as a process condition. As the diameters of the wafers have become greater and the thickness of the gate oxide films have become smaller in recent years, however, it has become all the more necessary to reduce the impedance difference. Moreover, a process window has become smaller and smaller to satisfy the requirement for finer etching performance and trade-off with performance such as a rate, for example, has no longer been established.

The inventors of the present invention have examined means for suppressing charging damage by offsetting the impedance difference by the electrode and making this offset amount variable without changing an optimal process condition for kinds of films and etching shapes.

Figure 16:
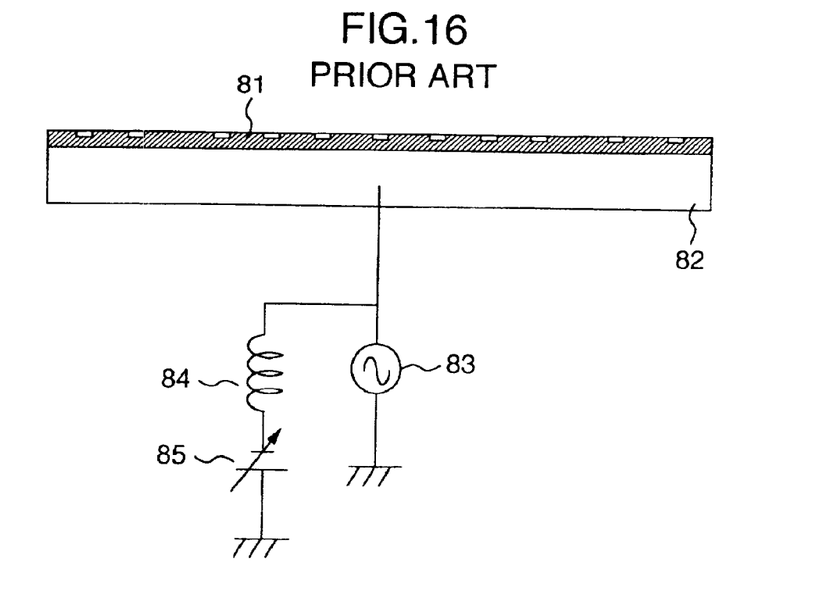
FIG. 16 is a schematic sectional view of an electrode film for installing a wafer and an explanatory view of an electric circuit according to the prior art.

FIG. 16 is a schematic sectional view of an electrode film having an electrostatic attraction function and used in conventional apparatuses. The drawing shows also a connection method of a radio frequency bias and a DC power supply for electrostatic attraction.

Referring to FIG. 16, reference numeral 81 denotes an insulating film, reference numeral 82 denotes an electrode base material, reference numeral 83 denotes a bias radio frequency power supply, reference numeral 84 denotes a DC pass filter and reference numeral 85 denotes a DC power supply.

In the conventional electrode, the impedance of the bias radio frequency power supply to the wafer is uniform inside the wafer plane. Therefore, the impedance difference inside the wafer plane, that occurs inside plasma, results as such in the overall impedance difference and charging damage occurs.

Means for eliminating this impedance difference is illustrated in Embodiments 5 to 7.

Embodiment 5

Figure 13:
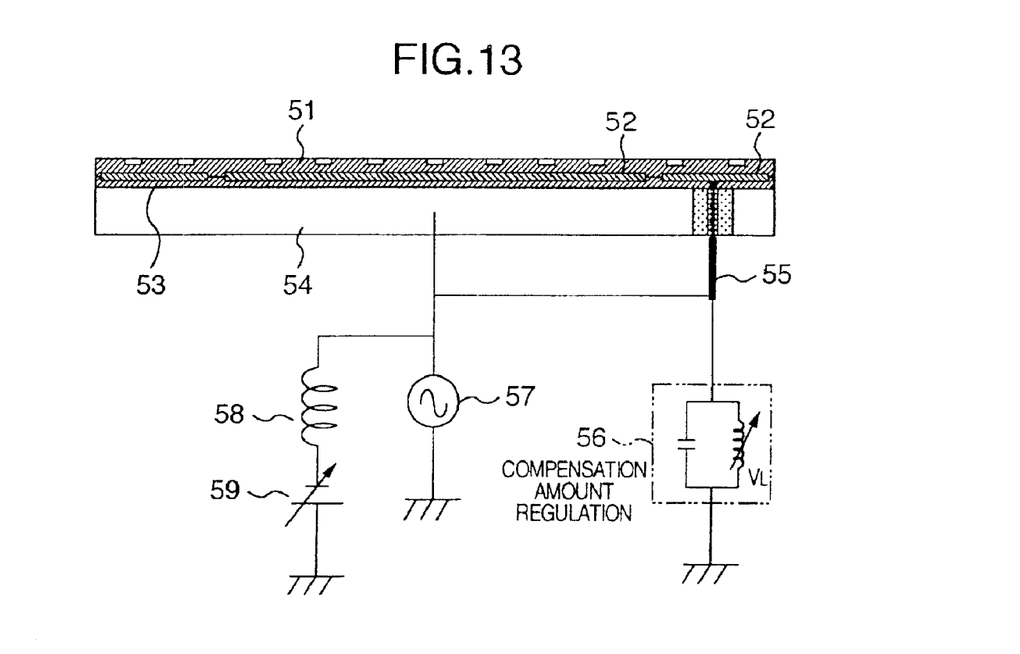
FIG. 13 is a schematic sectional view of an electrode film for installing a wafer and an explanatory view of an electric circuit in Embodiment 5.

FIG. 13 is a schematic sectional view of an electrode according to this embodiment and shows an example of electrical connection.

The electrode is formed by the steps of forming a first layer insulating film (alumina) 53 to a thickness of 300 μm on an electrode base material 54, then forming dividedly an intermediate electrode 52 made of tungsten at two positions, that is, at the center and the outer periphery of the electrode, to a thickness of 30 μm and forming further a second layer insulating film (alumina) 51 to a thickness of 300 μm.

A bias radio frequency power supply 57 and a DC power supply 59 for causing electrostatic attraction are connected to the intermediate electrode 52 at the center and to the outer periphery through the DC pass filter 58, respectively. A compensation amount regulation (adjusting) circuit 56 grounded through a feed line 55 is connected to the intermediate electrode 52 at the outer periphery. The compensation amount regulation circuit 56 may be constructed of a parallel resonant circuit formed basically of a capacitor and a variable-inductance inductor (winding) VL.

As the intermediate electrode 52 at the outer periphery is grounded, a part of the bias radio frequency current does not flow through the intermediate electrode 52 but flows to the ground. In consequence, the bias current flowing through the wafer decreases.

This corresponds effectively to the case where the impedance at the wafer outer periphery is increased to a higher level than at the center, and can offset the impedance difference occurring in plasma (corresponding to an impedance varying apparatus).

When an ordinary electrode is used in a hole forming processing of an oxide film at a high aspect ratio under a process condition in which a processing shape is optimized, a breakdown voltage defect is observed in 23% of the entire chips on the wafer. When the electrode according to Embodiment 5 of this invention is used and the value of the compensation amount regulation circuit 56 connected to the intermediate electrode 52 at the outer periphery is regulated, however, the breakdown voltage defect can be suppressed to 0% without affecting at all the process condition and the processing result.

In an SAC (Self-Aligned Contact) hole process in which 15% breakdown voltage defect occurs in the case of the ordinary electrode, the breakdown voltage defect can be suppressed to 0% when the value of the compensation amount regulation circuit is set to a constant value that reduces the current flowing through the ground in the case of the high aspect ratio hole forming processing.

Incidentally, the DC current necessary for electrostatic attraction of the wafer is supplied uniformly to the wafer through the radio frequency filter circuit and through the intermediate electrode at the center and the outer periphery. Therefore, attraction performance can be obtained equivalently to that of the conventional electrode.

Heat that enters the wafer flows to the electrode through the second layer insulating film 51, the intermediate electrode 52 and the lower first layer insulating film 53 on the surface of the electrode. The insulating films that govern the heat resistance have a uniform thickness in the planar direction of the wafer. Therefore, the temperature inside the wafer plane is uniform, too.

Embodiment 6

Figure 14:
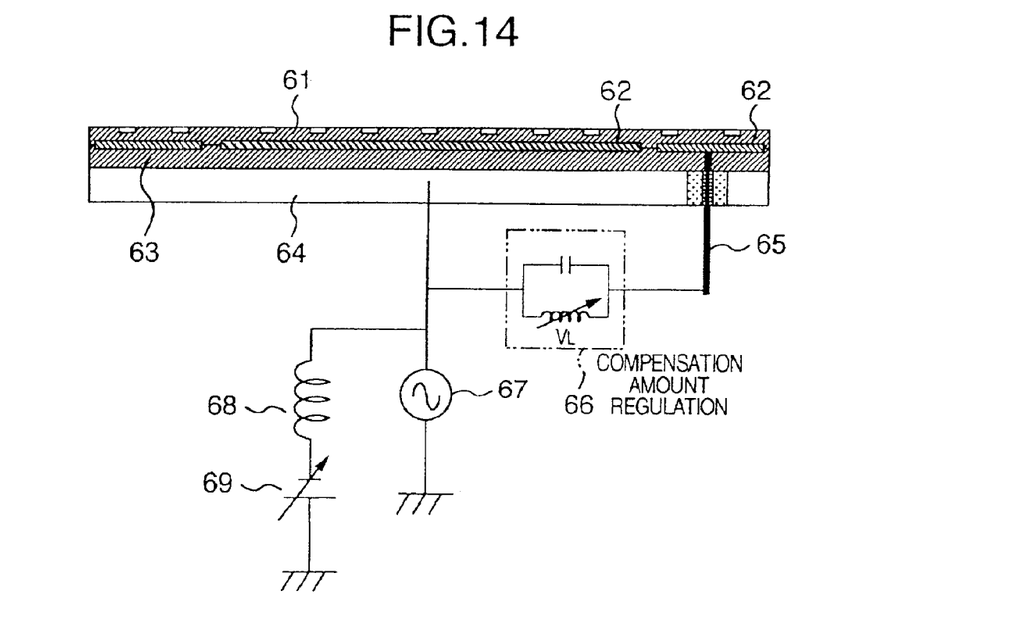
FIG. 14 is a schematic sectional view of an electrode film for installing a wafer and an explanatory view of an electric circuit in Embodiment 6.

FIG. 14 is a schematic sectional view of Embodiment 6 and shows also electric connection.

The electrode is the same as that of Embodiment 5. A first layer insulating film (alumina) 63 is formed to a thickness of 300 μm on an electrode base material 64. Next, an intermediate electrode 62 is formed dividedly at two positions, that is, at the center and the outer periphery of the electrode, to a thickness of 30 μm, and an insulating film (alumina) 61 is formed on the former to a thickness of 300 μm.

A bias radio frequency power supply 67 and a DC power supply 69 for causing electrostatic attraction are connected to the intermediate electrode 62 at the center, and to the intermediate electrode at the outer periphery through a compensation amount regulation circuit 66 formed of a capacitor and a variable inductor VL. In the drawing, reference numeral 63 denotes a second layer insulating film, reference numeral 64 denotes an electrode base material, reference numeral 65 denotes a power supply line and reference numeral 68 denotes a DC pass filter.

This compensation amount regulation circuit 66 gives an inductance (coil) component to the intermediate electrode 62 and constitutes a parallel resonance circuit with a capacitance (capacitor) component of the first layer insulating film 63 of the intermediate electrode 62 at the outer periphery. As a part of the radio frequency bias current supplied to the intermediate electrode 62 at the outer periphery is confined, the current to the wafer can be decreased and the impedance is effectively increased. Consequently, the impedance difference occurring in the plasma can be offset in the same way as in Embodiment 5.

The electrode according to this Embodiment 6 is applied to the oxide film hole forming process condition at a high aspect ratio and to the SAC hole forming process condition in the same way as in Embodiment 5. When the value of the regulation circuit connected to the intermediate electrode at the outer periphery is regulated in each case, the breakdown voltage defect can be suppressed to 0% without affecting at all the process condition and the processing result.

In the film structure of the electrode of this embodiment, electrostatic attraction performance and in-plane uniformity of the wafer temperature are equivalent to those of the electrode of Embodiment 5 and the ordinary electrode.

Embodiment 7

Figure 15:
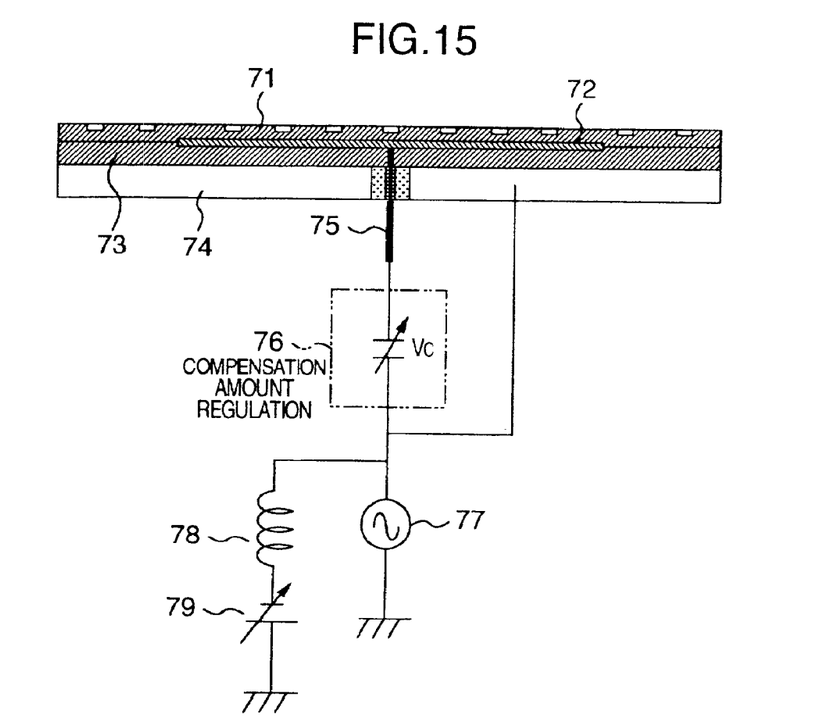
FIG. 15 is a schematic sectional view of an electrode film for installing a wafer and an explanatory view of an electric circuit in Embodiment 7.

FIG. 15 is a schematic sectional view of an electrode according to Embodiment 7 and shows also its electric connection.

The electrode has a similar structure to those of the electrodes of Embodiments 5 and 6. However, an intermediate electrode 72 is formed only at the center. A bias radio frequency power supply 77 and a DC power supply 79 for causing electrostatic attraction are connected to the intermediate electrode 72 through a compensation amount regulation circuit 76 including an adjustable-capacitance capacitor Vc. The compensation amount adjusting circuit 76 may be constructed by basically using a variable capacitance capacitor.

In FIG. 15, reference numeral 73 denotes a first layer insulating film, reference numeral 71 denotes a second layer insulating film, reference numeral 74 denotes an electrode base material, reference numeral 75 denotes a feed line, reference numeral 76 denotes a compensation amount regulation circuit and reference numeral 78 denotes a DC pass filter.

The intermediate electrode 72 at the center plays the role of adding a bypass current to a radio frequency bias current passing through the first layer. In this way, the impedance at the center can be effectively lowered with respect to the impedance at the outer periphery which does not have the intermediate electrode and to which the current is not added. This embodiment can therefore offset the impedance difference occurring in the plasma in the same way as in Embodiments 5 and 6.

The electrode of this embodiment is applied to the oxide film hole forming process at a high aspect ratio and to the SAC hole forming process in the same way as in Embodiment 5. When the value of the regulation circuit connected to the intermediate electrode at the center is regulated in each case, the breakdown voltage defect can be suppressed to 0% without affecting at all the process condition and the processing result.

In the film structure of the electrode of this embodiment, electrostatic attraction performance and in-plane uniformity of the wafer temperature are equivalent to those of the electrode of Embodiment 5 and the ordinary electrode.

The present invention can fabricate high-speed semiconductor devices susceptible to charging damage with an increased yield with a wafer having a large diameter.

What is claimed is:

1. A plasma etching method of a wafer, comprising the steps of:

electrostatically attracting said wafer which has a gate oxide film onto a water mounting electrode in a vacuum processing chamber;

introducing a mixed gas into said vacuum processing chamber on the basis of an etching recipe;

generating a magnetic field inside said vacuum processing chamber;

generating a plasma in said vacuum processing chamber;

applying a bias power to said wafer to accelerate ions in said plasma toward said wafer; and setting an impedance of a portion of said wafer mounting electrode which corresponds to an outer periphery of said wafer, as viewed from a bias power supply, to a value which is greater than that of a center portion of said wafer mounting electrode using an electrode arranged within said wafer mounting electrode at a position corresponding to the outer periphery of said wafer and formed under an insulating film for electrostatically attracting said wafer.

* * * * *